US011348901B1

(12) United States Patent
Hou et al.

(10) Patent No.: US 11,348,901 B1
(45) Date of Patent: May 31, 2022

(54) INTERFACIAL TILT-RESISTANT BONDED ASSEMBLY AND METHODS FOR FORMING THE SAME

(71) Applicant: SANDISK TECHNOLOGIES LLC, Addison, TX (US)

(72) Inventors: Lin Hou, Leuven (BE); Peter Rabkin, Cupertino, CA (US); Yangyin Chen, Leuven (BE); Masaaki Higashitani, Cupertino, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 17/106,884

(22) Filed: Nov. 30, 2020

(51) Int. Cl.
*H01L 25/065* (2006.01)
*H01L 23/00* (2006.01)
(Continued)

(52) U.S. Cl.
CPC .......... *H01L 25/0657* (2013.01); *H01L 24/11* (2013.01); *H01L 24/13* (2013.01);
(Continued)

(58) Field of Classification Search
CPC ..... H01L 25/0657; H01L 24/11; H01L 24/13; H01L 24/16; H01L 24/27; H01L 24/29; H01L 24/32; H01L 24/73; H01L 24/81; H01L 24/83; H01L 25/18; H01L 25/50; H01L 2224/11462; H01L 2224/13147; H01L 2224/16145; H01L 2224/27464; H01L 2224/29111; H01L 2224/32145; H01L 2224/73204; H01L 2224/81815;
(Continued)

(56) References Cited

U.S. PATENT DOCUMENTS 10,283,493 B1   5/2019  Nishida
11,211,319 B2 * 12/2021 Fang ................. H01L 23/49838
(Continued)

FOREIGN PATENT DOCUMENTS

KR   10-2008-004451 A   5/2008
KR   10-1716882 B1      3/2017
WO   WO 2020/159604 A1  8/2020

OTHER PUBLICATIONS

Derakhshandeh, J. et al., "10 and 7 μm Pitch Thermo-compression Solder Joint, Using A Novel Solder Pillar and Metal Spacer Process," 2020 *IEEE 70th Electronic Components and Technology Conference (ECTC)*, Orlando, FL, USA, 2020, pp. 617-622, doi: 10.1109/ECTC32862.2020.00102.
(Continued)

*Primary Examiner* — Douglas W Owens
(74) *Attorney, Agent, or Firm* — The Marbury Law Group PLLC (57) ABSTRACT

A first bonding unit is provided, which includes a first substrate, a first passivation dielectric layer, and first bonding pads. A second bonding unit is provided, which includes a second substrate, a second passivation dielectric layer, and second bonding pads including bonding pillar structures. Solder material portions are formed on physically exposed surfaces of the first bonding pads. The second bonding unit is attached to the first bonding unit by bonding the at least one of the bonding pillar structures to a respective solder material portion.

20 Claims, 7 Drawing Sheets

(51) Int. Cl.
 H01L 25/00 (2006.01)
 H01L 25/18 (2006.01)
(52) U.S. Cl.
 CPC .............. *H01L 24/16* (2013.01); *H01L 24/27* (2013.01); *H01L 24/29* (2013.01); *H01L 24/32* (2013.01); *H01L 24/73* (2013.01); *H01L 24/81* (2013.01); *H01L 24/83* (2013.01); *H01L 25/18* (2013.01); *H01L 25/50* (2013.01); *H01L 2224/11462* (2013.01); *H01L 2224/13147* (2013.01); *H01L 2224/16145* (2013.01); *H01L 2224/27464* (2013.01); *H01L 2224/29111* (2013.01); *H01L 2224/32145* (2013.01); *H01L 2224/73204* (2013.01); *H01L 2224/81815* (2013.01); *H01L 2224/83815* (2013.01); *H01L 2225/06513* (2013.01); *H01L 2924/1431* (2013.01); *H01L 2924/14511* (2013.01)
(58) Field of Classification Search
 CPC . H01L 2224/83815; H01L 2225/06513; H01L 2924/1431; H01L 2924/14511
 See application file for complete search history.

(56) References Cited

U.S. PATENT DOCUMENTS

| | | | |
|---|---|---|---|
| 2005/0230804 | A1 | 10/2005 | Tanida et al. |
| 2010/0032833 | A1 | 2/2010 | Higaki et al. |
| 2017/0250162 | A1 | 8/2017 | Soga et al. |
| 2019/0310410 | A1* | 10/2019 | Oh ................. G02B 6/0068 |
| 2020/0066745 | A1 | 2/2020 | Yu et al. |
| 2021/0143115 | A1* | 5/2021 | Wu ................... H01L 24/80 |

OTHER PUBLICATIONS

Derakhshandeh, J. et al., "Die to wafer 3D stacking for below 10um pitch microbumps," 2016 *IEEE International 3D Systems Integration Conference (3DIC)*, San Francisco, CA, 2016, pp. 1-4, doi: 10.1109/3DIC.2016.7969993.

Kovac, Z et al., "Immersion tin: Its chemistry, metallurgy, and application in electronic packaging technology." *IBM journal of research and development* 28.6 (1984): 726-734.

Marques, V. MF, et al. "Nanomechanical Characterization of Sn—Ag—Cu/Cu Joints—Part 1: Young's Modulus, Hardness and Deformation Mechanisms as a Function of Temperature." *Acta Materialia*, vol. 61, No. 7, *Acta Materialia*, 2013, pp. 2460-2470.

U.S. Appl. No. 16/263,058, filed Jan. 31, 2019, SanDisk Technologies LLC.

U.S. Appl. No. 16/263,086, filed Jan. 31, 2019, SanDisk Technologies LLC.

U.S. Appl. No. 16/372,908, filed Apr. 2, 2019, SanDisk Technologies LLC.

U.S. Appl. No. 16/391,632, filed Apr. 23, 2019, SanDisk Technologies LLC.

U.S. Appl. No. 16/682,848, filed Nov. 13, 2019, SanDisk Technologies LLC.

U.S. Appl. No. 16/694,400, filed Nov. 25, 2019, SanDisk Technologies LLC.

U.S. Appl. No. 16/825,304, filed Mar. 20, 2020, SanDisk Technologies LLC.

U.S. Appl. No. 16/825,397, filed Mar. 20, 2020, SanDisk Technologies LLC.

U.S. Appl. No. 16/886,164, filed May 28, 2020, SanDisk Technologies LLC.

U.S. Appl. No. 16/886,221, filed May 28, 2020, SanDisk Technologies LLC.

Notification of Transmittal of the International Search Report and the Written Opinion of the International Searching Authority for International Patent Application No. PCT/US2021/035845, dated Oct. 28, 2021, 11 pages.

* cited by examiner

INTERFACIAL TILT-RESISTANT BONDED ASSEMBLY AND METHODS FOR FORMING THE SAME

FIELD

The present disclosure relates generally to the field of semiconductor devices, and particularly to a bonded assembly configured to limit interfacial tilt for enhanced electrical connection between bonding units and methods for forming the same.

BACKGROUND

A three-dimensional memory device may be bonded to a logic die including a peripheral circuit. Tilt at the interface between the bonded die may cause disconnection between some of the mating pairs of bonding pads of the respective bonding die, leading to open circuits.

SUMMARY

According to an aspect of the present disclosure, a bonded assembly comprises a first bonding unit comprising a first substrate, first metal interconnect structures embedded in first dielectric material layers, a first passivation dielectric layer having a first proximal surface contacting one of the first dielectric material layers and a first distal surface that is spaced from the first proximal surface by a thickness of the first passivation dielectric layer, first bonding pads located within and laterally surrounded by a respective opening in the first passivation dielectric layer, wherein distal surfaces of the first bonding pads are recessed relative to the first distal surface of the first passivation dielectric layer, and solder material portions located within and laterally surrounded by a respective opening in the first passivation dielectric layer, and a second bonding unit comprising a second substrate, second metal interconnect structures embedded in second dielectric material layers, a second passivation dielectric layer having a second proximal surface contacting one of the second dielectric material layers and a second distal surface that is spaced from the second proximal surface by a thickness of the second passivation dielectric layer, and second bonding pads located within and laterally surrounded by a respective opening the second passivation dielectric layer, wherein each of the second bonding pads comprises a bonding pillar structure that protrudes past a horizontal plane including the second distal surface. A first subset of the bonding pillar structures directly contacts a first subset of the first bonding pads, and a second subset of the bonding pillar structures does not directly contact any of the first bonding pads, such that a respective one of a second subset of solder material portions is located between each one of the second subset of the bonding pillar structures and each respective one of a second subset of the first bonding pads, and such that the respective one of the second subset of solder material portions provides electrical contact between each one of the second subset of the bonding pillar structures and each respective one of the second subset of the first bonding pads.

According to another aspect of the present disclosure, a method of forming a bonded assembly comprises providing a first bonding unit, wherein the first bonding unit comprises a first substrate, first metal interconnect structures embedded in first dielectric material layers, a first passivation dielectric layer having a first proximal surface contacting one of the first dielectric material layers and a first distal surface that is spaced from the first proximal surface by a thickness of the first passivation dielectric layer, and first bonding pads located within and laterally surrounded by a respective opening in the first passivation dielectric layer, wherein distal surfaces of the first bonding pads are recessed relative to the first distal surface of the first passivation dielectric layer, forming solder material portions on physically exposed surfaces of the first bonding pads, providing a second bonding unit, wherein the second bonding unit comprises a second substrate, second metal interconnect structures embedded in second dielectric material layers, a second passivation dielectric layer having a second proximal surface contacting one of the second dielectric material layers and a second distal surface that is spaced from the second proximal surface by a thickness of the second passivation dielectric layer and second bonding pads located within and laterally surrounded by a respective opening the second passivation dielectric layer, wherein each of the second bonding pads comprises a bonding pillar structure that protrudes past a horizontal plane including the second distal surface, and reflowing the solder material portions while pressing the first bonding unit and the second bonding unit to each other such that at least a first subset of the bonding pillar structures squeezes out a first subset of the solder material portions and directly contacts a first subset of the first bonding pads.

DETAILED DESCRIPTION

The embodiments of the present disclosure are directed to a bonded assembly configured to limit disconnection between mating pairs of bonding pads of the bonded die which are tilted at the bonding interface relative to each other, and methods for forming the same, the various aspects of which are described in detail herebelow.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many external commands as the total number of planes therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Figure 1A:
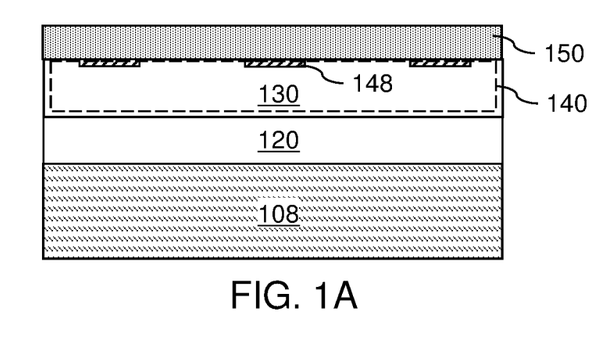
FIGS. 1A-1D are sequential vertical cross-sectional views of a first configuration of a first bonding unit during manufacture according to an embodiment of the present disclosure.

FIGS. 1A-1D are sequential vertical cross-sectional views of a first configuration of a first bonding unit during manufacture according to an embodiment of the present disclosure. Referring to FIG. 1A, a first bonding unit can include a first substrate 108, optional first semiconductor devices 120 formed on a top surface of the first substrate 108, first metal interconnect structures 140 embedded within first dielectric material layers 130, and a first passivation dielectric layer 150. In one embodiment, the first bonding unit may comprise a first semiconductor die, which may be, for example, a memory die or a logic die. In another embodiment, the first bonding unit may comprise an interposer, which may be a ceramic interposer or a laminate interposer. In case the first bonding unit comprises an interposer, the first semiconductor devices 120 may be omitted.

Generally, the first bonding unit may be provided in a first wafer including an array of first semiconductor dies, or may be provided as a stand-alone unit, such as an interposer. In case the first bonding unit is provided in the first wafer, the first wafer may include an array of semiconductor dies, and the first semiconductor die may be one of the semiconductor dies within the array of semiconductor dies. In case the first bonding unit is provided within the first wafer, the first wafer may comprise a first semiconductor wafer, such as a commercially available single crystalline silicon wafer.

In case the first bonding unit comprises the first semiconductor die, the first semiconductor devices 120 may comprise any type of semiconductor devices known in the art. In an illustrative example, the first semiconductor die may comprise a memory die including a three-dimensional array of memory elements, such as a vertical NAND memory array. Alternatively, the first semiconductor devices may include a logic die. In case a second bonding unit to be subsequently employed comprises a memory die, the first bonding unit may comprise a logic die including a peripheral circuit configured to control operation of memory elements within the memory die.

The first metal interconnect structures 140 can include metal via structures and metal line structures that are configured to provide electrical interconnection between and/or to a respective node (e.g., source, drain and/or gate) of the first semiconductor devices 120. The first metal interconnect structures 140 may comprise tungsten, copper, cobalt, tantalum, titanium, molybdenum, ruthenium, and/or conductive alloys and/or conductive compounds thereof. The total numbers of levels of metal lines within the first metal interconnect structures 140 may be in a range from 1 to 20, such as from 2 to 10. The total number of levels of metal via structures within the first metal interconnect structures 140 may be in a range from 1 to 20, such as from 2 to 10. In one embodiment, the first metal interconnect structures 140 may include optional first distal metal interconnect structures 148 that are most distal from the first substrate 108 among the first metal interconnect structures 140. In one embodiment, the first distal metal interconnect structures 148 may include metal pads or metal lines. Alternatively, the first distal metal interconnect structures 148 may be omitted.

In case the first bonding unit comprises a semiconductor die, the first dielectric material layers 130 may include at least one interlayer dielectric (ILD) material, which may include, for example, undoped silicate glass, doped silicate glass, organosilicate glass, silicon carbide nitride, silicon oxynitride, and/or silicon nitride. In case the first bonding unit comprises an interposer, the first dielectric material layers 130 may include at least one polymer material that can be laminated, or may include at least one ceramic material. The total thickness of the first dielectric material layers 130 may be in a range from 500 nm to 10 microns, although lesser and greater thicknesses may also be employed.

The first passivation dielectric layer 150 includes a dielectric material that can prevent diffusion of hydrogen, moisture, and/or metallic contaminants. For example, the first passivation dielectric layer 150 may include, and/or consist essentially of, at least one of a silicon nitride layer, a silicon nitride carbide layer, or a polymer material layer (such as a polyimide layer). The total thickness of the first passivation dielectric layer 150 may be in a range from 500 nm to 5 microns, although lesser and greater thicknesses may also be employed. The first passivation dielectric layer 150 may be deposited as a blanket passivation dielectric layer over a top surface (i.e., a distal surface) of the first dielectric material layers 130. As used herein, a blanket layer refers to an unpatterned material layer.

Figure 1B:
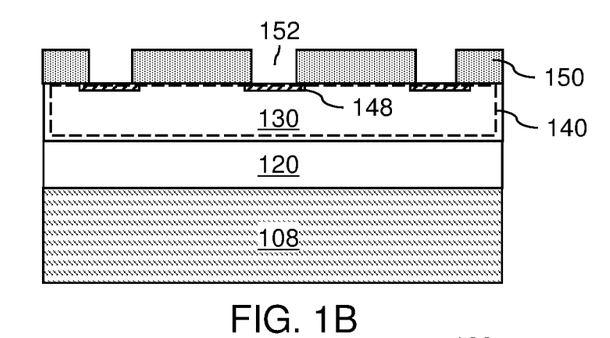

Referring to FIG. 1B, an array of openings 152 can be formed through the blanket passivation dielectric layer such that a top surface of a respective first distal metal interconnect structure 148 is physically exposed underneath the openings through the blanket passivation dielectric layer. The continuous remaining portion of the blanket passivation dielectric layer after formation of the array of openings 152 therethrough constitutes the first passivation dielectric layer 150.

In one embodiment, the openings 152 in the first passivation dielectric layer 150 may be arranged as a periodic two-dimensional array of openings. In one embodiment, the periodic two-dimensional array of openings 152 may comprise a rectangular two-dimensional array of openings having a first pitch along a first horizontal direction and having a second pitch along a second horizontal direction that is perpendicular to the first horizontal direction. In one embodiment, each of the first pitch and the second pitch may be in a range from 2 microns to 30 microns, such as from 5 microns to 10 microns, although lesser and greater pitches may also be employed. Edges of adjacent openings 152 may be spaced apart by a distance in a range from 1 micron to 5 microns, and a width (e.g., diameter) of each opening 152 may be in a range from 2 microns to 10 microns, such as 3 microns to 5 microns.

Figure 1C:
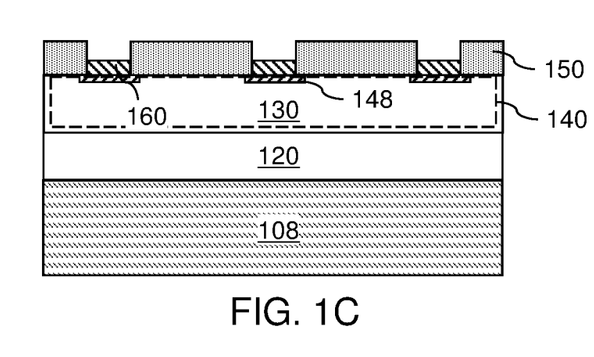

Referring to FIG. 1C, an electroplating process or an electroless plating process can be performed to selectively deposit metal portions within the openings in the first passivation dielectric layer 150 directly on physically exposed surfaces of the first distal metal interconnect structures 148. The metal portions constitute first bonding pads 160. The metal portions can include at least one metallic material that may be deposited by electroplating or electroless plating. In one embodiment, the first bonding pads 160 may include a metallic material such as copper, silver, gold, nickel, brass, palladium, and/or a cobalt-tungsten-phosphorus alloy. In one embodiment, the thickness of the first bonding pads 160 may be less than the thickness of the first passivation dielectric layer 150. For example, the thickness of the first bonding pads 160 may be in a range from 300 nm to 4 microns, although lesser and greater thicknesses may also be employed.

Figure 1D:
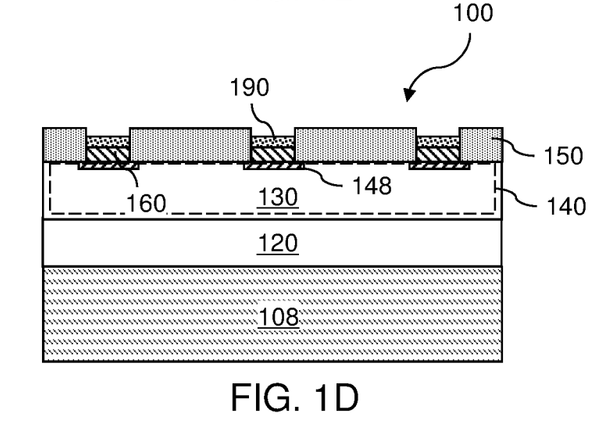

Referring to FIG. 1D, an array of solder material portions 190 can be formed on the physically exposed surfaces of the first bonding pads 160. The solder material portions 190 may be tin-based, and may include tin at an atomic percentage greater than 50%. The solder material portions 190 may consist of 99 to 100 atomic percent tin with unavoidable impurities, or include a tin alloy containing tin at an atomic percentage of 75% to 99% and remainder one or more other metals of the alloy, such as indium, copper, silver, nickel, bismuth and/or lead, or oxides thereof. In one embodiment, the array of solder material portions 190 can be formed by immersion deposition of a solder material directly on surfaces of the first bonding pads 160 employing an immersion plating bath. Exemplary processes for immersion deposition of a solder material is described, for example, in Kovac et al., "Immersion tin: Its chemistry, metallurgy, and application in electronic packaging technology" IBM Journal of Research and Development 28.6 (1984), 726-734. The thickness of the solder material portions 190 can be selected such that the top surfaces (i.e., the distal surfaces that are distal from the first substrate 108) of the solder material portions 190 are located below the horizontal plane including the top surface (i.e., the distal surface) of the first passivation dielectric layer 150. For example, the thickness of the solder material portions 190 may be 100 nm to 1 micron.

Generally, the first bonding unit 100 comprises a first substrate 108, first metal interconnect structures 140 embedded in first dielectric material layers 130, a first passivation dielectric layer 150 having a first proximal surface contacting one of the first dielectric material layers 130 and a first distal surface that is spaced from the first proximal surface by a thickness of the first passivation dielectric layer 150, and first bonding pads 160 located within, and laterally surrounded by, a respective opening in the first passivation dielectric layer 150.

The distal surfaces of the first bonding pads 160 can be recessed relative to the first distal surface of the first passivation dielectric layer 150. An array of solder material portions 190 can be located on physically exposed surfaces of the first bonding pads 160. Each of the first bonding pads 160 can have a sidewall that contacts the first passivation dielectric layer 150. In one embodiment, the entire volume of the array of solder material portions 190 can be located between a horizontal plane including interfaces between the array of solder material portions 190 and the first bonding pads 160 and a horizontal plane including the first distal surface of the first passivation dielectric layer 150.

Figure 2A:
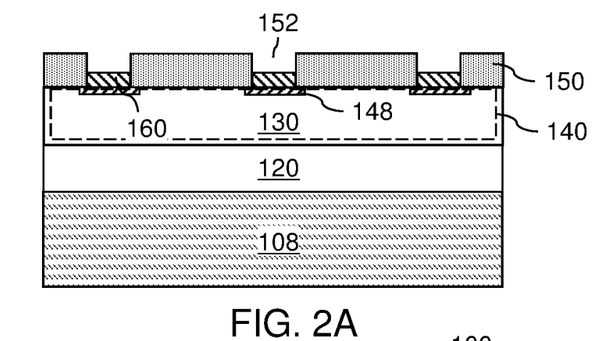
FIGS. 2A-2C are sequential vertical cross-sectional views of a second configuration of a first bonding unit during manufacture according to an embodiment of the present disclosure.
Figure 2B:
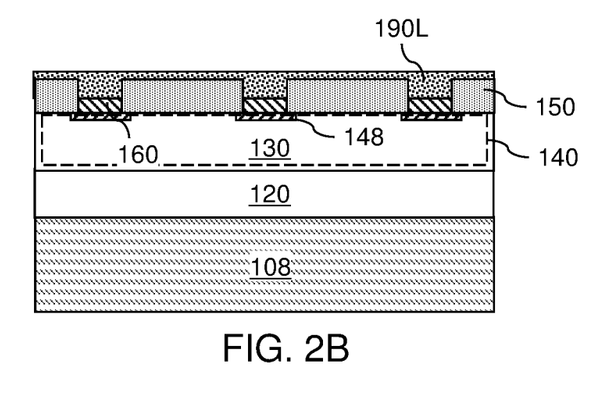
Figure 2C:
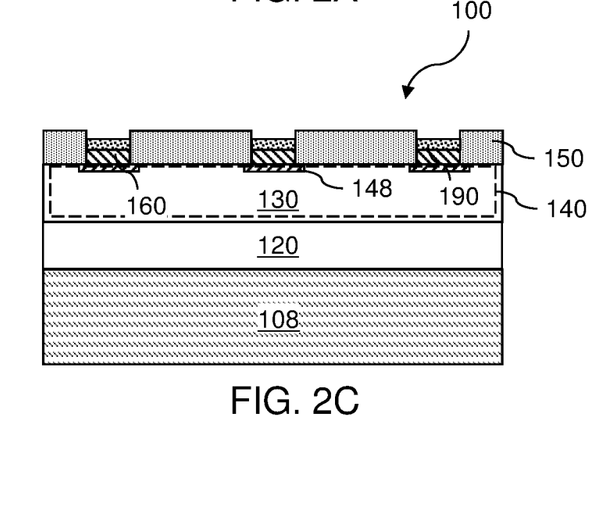

FIGS. 2A-2C are sequential vertical cross-sectional views of a second configuration of a first bonding unit during manufacture according to an embodiment of the present disclosure. Referring to FIG. 2A, the second configuration of the first bonding unit may be the same as the first configuration of the first bonding unit illustrated in FIG. 1C.

Referring to FIG. 2B, a solder material may be deposited by a selective deposition process or a non-selective deposition process to form a solder material layer 190L. The solder material layer 190L may include a tin-based solder material described above. The solder material layer 190L may be deposited by electroplating or physical vapor deposition. In one embodiment, the solder material layer 190L may be deposited by a non-selective deposition process such as a physical vapor deposition process. The solder material layer 190L may have a top surface that continuously extends over the first passivation dielectric layer 150.

Referring to FIG. 2C, the solder material can be planarized by removing portions of the solder material layer 190L from above a horizontal plane including the first distal surface of the first passivation dielectric layer 150. For example, the solder material can be removed from above the horizontal plane including the first distal surface of the first passivation dielectric layer 150, for example, by a chemical mechanical planarization (i.e., chemical mechanical polishing, CMP) process or a recess etch process. In one embodiment, the solder material layer 190L may be isotropically recessed, for example, by a dry etch process or a wet etch process. In one embodiment, the solder material may be vertically recessed within the openings 152 in the first passivation dielectric layer 150. An array of solder material portions 190 can be formed. In one embodiment, top surfaces of the solder material portions 190 can be located below the horizontal plane including the first distal surface of the first passivation dielectric layer 150.

Figure 3A:
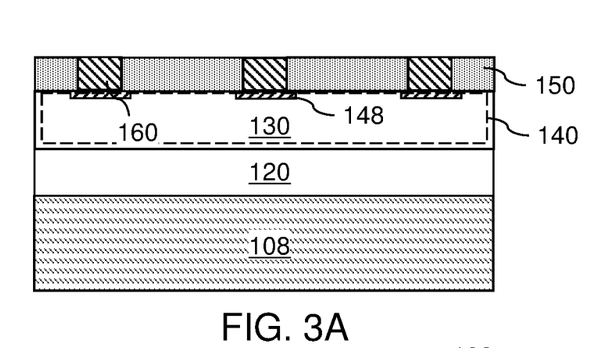
FIGS. 3A-3C are sequential vertical cross-sectional views of a third configuration of a first bonding unit during manufacture according to an embodiment of the present disclosure.
Figure 3B:
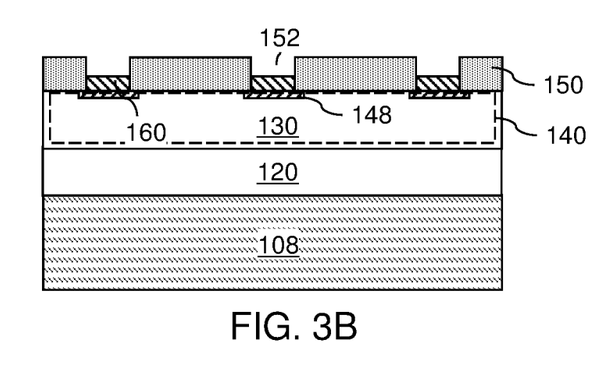
Figure 3C:
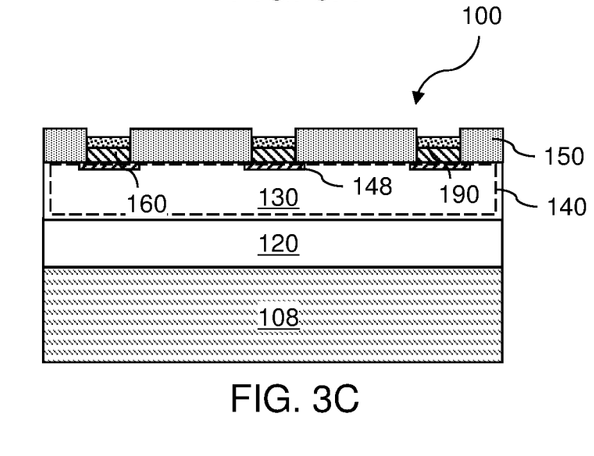

FIGS. 3A-3C are sequential vertical cross-sectional views of a third configuration of a first bonding unit during manufacture according to an embodiment of the present disclosure. Referring to FIG. 3A, the third configuration of the first bonding unit may be derived from the first configuration of the first bonding unit illustrated in FIG. 1C by prolonging the deposition process that forms the first bonding pads 160. For example, deposition of the metallic material of the first bonding pads 160 can be prolonged such that the metallic material fills the entire volume of the openings 152 through the first passivation dielectric layer 150. In one embodiment, the metallic material may be deposited by electroplating the metallic material directly on a physically exposed surfaces of the first distal metal interconnect structures 148, which are surfaces of a subset of the first metal interconnect structures 140. The metallic material may be electroplated to fill each of the openings 152 in the first passivation dielectric layer 150.

Portions of the metallic material can be removed from above the horizontal plane including the first distal surface of the first passivation dielectric layer 150 by a planarization process, such as a chemical mechanical planarization process. Top surfaces of the first bonding pads 160 may be coplanar with the top surface of the first passivation dielectric layer 150.

Referring to FIG. 3B, a recess etch process can be performed to vertically recess the first bonding pads 160 within the openings 152 in the first passivation dielectric layer 150. The top surfaces (i.e., the distal surfaces) of the first bonding pads 160 can be vertically recessed below the horizontal plane including the top surface of the first passivation dielectric layer 150. An array of first bonding pads 160 is thus formed.

Referring to FIG. 3C, the processing steps of FIG. 1D or the processing steps of FIGS. 2B and 2C can be performed to form an array of solder material portions 190.

Figure 4A:
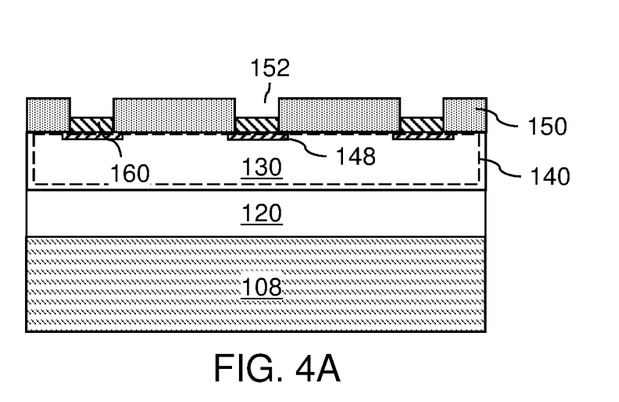
FIGS. 4A-4D are sequential vertical cross-sectional views of a fourth configuration of a first bonding unit during manufacture according to an embodiment of the present disclosure.

FIGS. 4A-4D are sequential vertical cross-sectional views of a fourth configuration of a first bonding unit during manufacture according to an embodiment of the present disclosure. Referring to FIG. 4A, the second configuration of the first bonding unit may be the same as the third configuration of the first bonding unit illustrated in FIG. 3B.

Figure 4B:
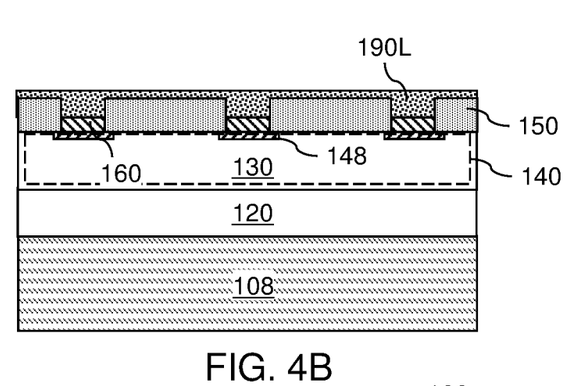

Referring to FIG. 4B, the processing steps of FIG. 2B can be performed to deposit a solder material. A solder material layer 190L is formed, which continuously extends over the top surface of the first passivation dielectric layer 150.

Figure 4C:
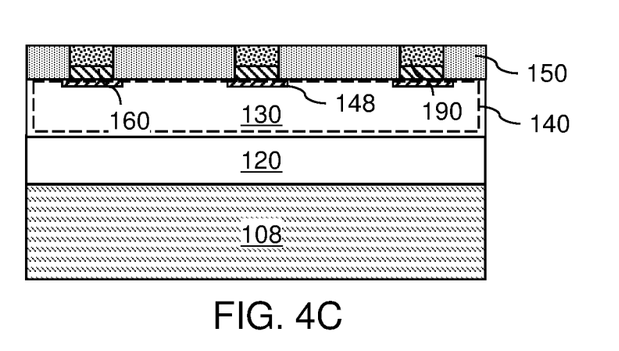

Referring to FIG. 4C, the solder material can be planarized by removing portions of the solder material layer 190L from above a horizontal plane including the first distal surface of the first passivation dielectric layer 150. For example, the solder material can be removed from above the horizontal plane including the first distal surface of the first passivation dielectric layer 150, for example, by a chemical mechanical planarization process.

Figure 4D:
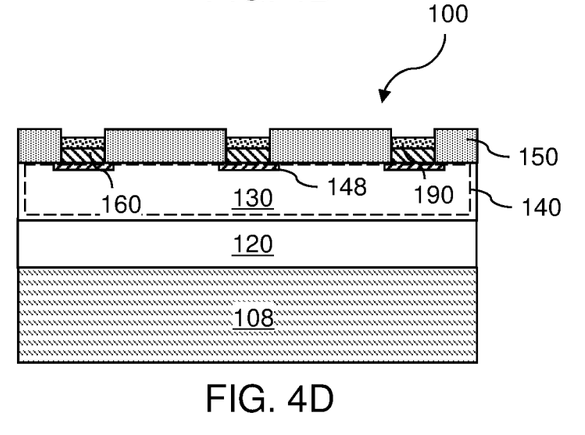

Referring to FIG. 4D, an etch process can be performed to vertically recess the solder material in the openings 152 in the first passivation dielectric layer 150. The solder material can be isotropically recessed, for example, by a dry etch process or a wet etch process. An array of solder material portions 190 can be formed. In one embodiment, top surfaces of the solder material portions 190 can be located below the horizontal plane including the first distal surface of the first passivation dielectric layer 150.

FIGS. 5A-5F are sequential vertical cross-sectional views of a second bonding unit during manufacture according to an embodiment of the present disclosure.

Figure 5A:
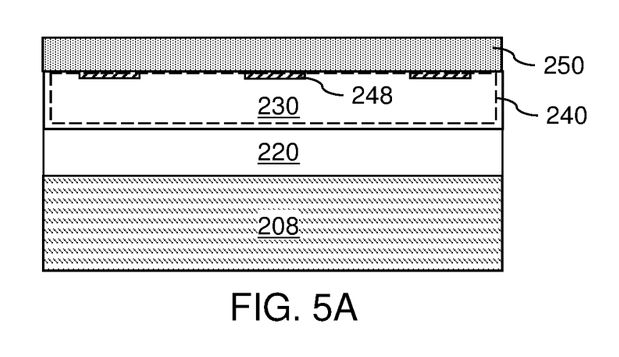
FIGS. 5A-5F are sequential vertical cross-sectional views of a second bonding unit during manufacture according to an embodiment of the present disclosure.

Referring to FIG. 5A, a second bonding unit can include a second substrate 208, optional second semiconductor devices 220 formed on a top surface of the second substrate 208, second metal interconnect structures 240 embedded within second dielectric material layers 230, and a second passivation dielectric layer 250. In one embodiment, the second bonding unit may comprise a second semiconductor die, which may be, for example, a memory die or a logic die. In another embodiment, the second bonding unit may comprise an interposer, which may be a ceramic interposer or a laminate interposer. In case the second bonding unit comprises an interposer, the second semiconductor devices 220 may be omitted.

Generally, the second bonding unit may be provided in a second wafer including an array of semiconductor dies, or may be provided as a stand-alone unit such as an interposer. In case the second bonding unit is provided in the second wafer, the second wafer may include an array of semiconductor dies, and the second semiconductor die may be one of the semiconductor dies within the array of semiconductor dies. In case the second bonding unit is provided within the second wafer, the second wafer may comprise a second semiconductor wafer, such as a commercially available single crystalline silicon wafer.

In case the second bonding unit comprises a second semiconductor die, the second semiconductor devices 220 may comprise any type of semiconductor devices known in the art. In an illustrative example, the second semiconductor die may comprise a memory die including a three-dimensional array of memory elements, such as a vertical NAND memory array. Alternatively, the second semiconductor devices may include a logic die. In case the first bonding unit comprises a memory die, the second bonding unit may comprise a logic die including a peripheral circuit configured to control operation of memory elements within the memory die, and vice versa. In one embodiment, one of the first bonding unit and the second bonding unit may comprise a memory die including a three-dimensional array of memory elements such as a three-dimensional array of NAND memory elements, and another of the first bonding unit and the second bonding unit may include a logic die including a peripheral (i.e., driver) circuit configured to control operation of the three-dimensional array of memory elements.

The second metal interconnect structures 240 can include metal via structures and metal line structures that are configured to provide electrical interconnection among, and/or to, a respective node of the second semiconductor devices 220. The second metal interconnect structures 240 may comprise tungsten, copper, cobalt, tantalum, titanium, molybdenum, ruthenium, and/or conductive alloys and/or conductive compounds thereof. The total numbers of levels of metal lines within the second metal interconnect structures 240 may be in a range from 2 to 20, such as from 2 to 20. The total number of levels of metal via structures within the second metal interconnect structures 240 may be in a range from 2 to 20, such as from 2 to 20. In one embodiment, the second metal interconnect structures 240 may optionally include second distal metal interconnect structures 248 that are most distal from the second substrate 208 among the second metal interconnect structures 240. In one embodiment, the second distal metal interconnect structures 248 may include metal pads or metal lines. Alternatively, the second distal metal interconnect structures 248 may be omitted.

In case the second bonding unit comprises a semiconductor die, the second dielectric material layers 230 may include at least one interlayer dielectric (ILD) material, which may include, for example, undoped silicate glass, doped silicate glass, organosilicate glass, silicon carbide nitride, silicon oxynitride, and/or silicon nitride. In case the second bonding unit comprises an interposer, the second dielectric material layers 230 may include at least one polymer material that can be laminated, or may include at least one ceramic material. The total thickness of the second dielectric material layers 230 may be in a range from 500 nm to 20 microns, although lesser and greater thicknesses may also be employed.

The second passivation dielectric layer 250 includes a dielectric material that can prevent diffusion of hydrogen, moisture, and/or metallic contaminants. For example, the second passivation dielectric layer 250 may include, and/or consist essentially of, at least one of a silicon nitride layer, a silicon nitride carbide layer, or a polymer material layer (such as a polyimide layer). The total thickness of the second passivation dielectric layer 250 may be in a range from 500 nm to 5 microns, although lesser and greater thicknesses may also be employed. The second passivation dielectric layer 250 may be deposited as a blanket passivation dielectric layer over a top surface (i.e., a distal surface) of the second dielectric material layers 230.

Figure 5B:
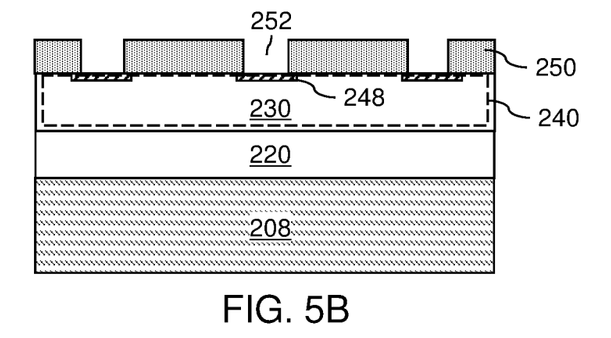

Referring to FIG. 5B, an array of openings 252 can be formed through the blanket passivation dielectric layer such that a top surface of a respective second distal metal interconnect structure 248 is physically exposed underneath the openings through the blanket passivation dielectric layer. The continuous remaining portion of the blanket passivation dielectric layer after formation of the array of openings 252 therethrough constitutes the second passivation dielectric layer 250.

In one embodiment, the openings 252 in the second passivation dielectric layer 250 may be arranged as a periodic two-dimensional array of openings. In one embodiment, the periodic two-dimensional array of openings may comprise a rectangular two-dimensional array of openings having a second pitch along a second horizontal direction and having a second pitch along a second horizontal direction that is perpendicular to the second horizontal direction. In one embodiment, each of the second pitch and the second pitch may be in a range from 2 microns to 30 microns, such as from 5 microns to 10 microns, although lesser and greater pitches may also be employed. Edges of adjacent openings 252 may be spaced apart by a distance in a range from 1 micron to 5 microns, and a width (e.g., diameter) of each opening 152 may be in a range from 2 microns to 10 microns, such as 3 microns to 5 microns. In one embodiment, the pattern of the openings 252 in the second passivation dielectric layer 250 may be a mirror image pattern of the pattern of the openings 152 in the first passivation dielectric layer 150.

Figure 5C:
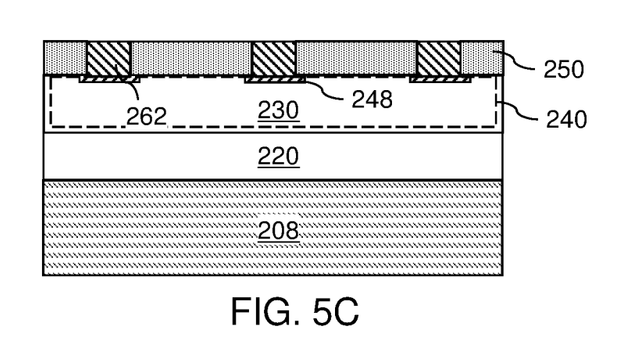

Referring to FIG. 5C, metal portions can be selectively deposited within the openings in the second passivation dielectric layer 250. An electroplating process or an electroless plating process can be performed to selectively deposit metal portions within the openings in the second passivation dielectric layer 250 directly on physically exposed surfaces of the second distal metal interconnect structures 248. The metal portions constitute pad base portions 262, which are base portions of second bonding pads to be subsequently completed. The metal portions can include at least one metallic material that may be deposited by electroplating or electroless plating. In one embodiment, the pad base portions 262 may include a metallic material such as copper, silver, gold, nickel, brass, palladium, and/or a cobalt-tungsten-phosphor alloy. In one embodiment, the thickness of the pad base portions 262 may be less than the thickness of the second passivation dielectric layer 250. For example, the thickness of the pad base portions 262 may be in a range from 300 nm to 4 microns, although lesser and greater thicknesses may also be employed.

Figure 5D:
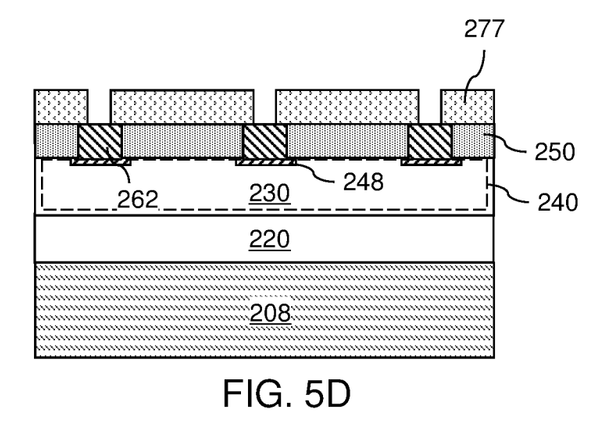

Referring to FIG. 5D, a photoresist layer 277 can be applied over the second passivation dielectric layer 250, and can be lithographically patterned to form an array of openings therein. In one embodiment, each opening in the patterned photoresist layer 277 can be formed over, and within the area of, a respective one of the pad base portions 262. In one embodiment, a periphery of each opening in the patterned photoresist layer 277 can be laterally offset inward from a periphery of an underlying opening 252 in the second passivation dielectric layer 250. In one embodiment, each opening in the patterned photoresist layer 277 may have a shape of a circle, a rectangle, or a rounded rectangle. The maximum lateral dimension of each opening in the patterned photoresist layer 277 may be in range from 10% to 90%, such as from 40% to 70%, of the maximum lateral dimension of an underlying one of the pad base portions 262. In one embodiment, each opening in the patterned photoresist layer 277 may have a circular horizontal cross-sectional shape having a diameter in a range from 1 micron to 20 microns, such as from 2 microns to 8 microns, although lesser and greater dimensions may also be employed.

Figure 5E:
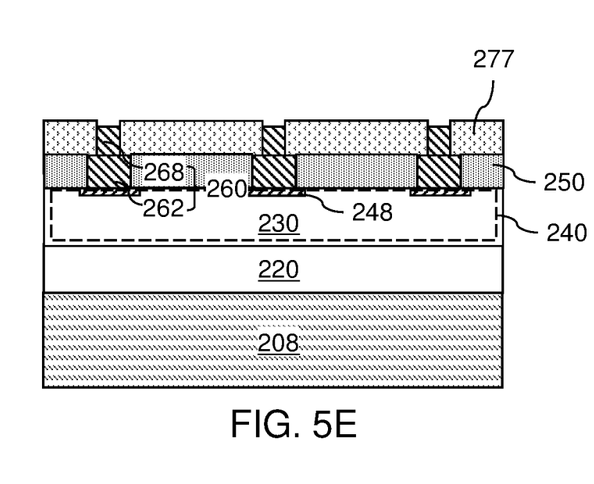

Referring to FIG. 5E, a metallic material, such as copper or a copper based alloy can be formed in the openings in the patterned photoresist layer 277 directly on physically exposed surfaces of the pad base portions 262. In one embodiment, an electroplating process or an electroless plating process can be performed to selectively deposit metal (e.g., copper or copper based alloy, nickel or nickel based alloy, cobalt or cobalt based alloy, etc.) portions within the openings in the patterned photoresist layer 277 directly on a respective one of the pad base portions 262. Alternatively, non-selective metal deposition, such as metal-organic chemical vapor deposition or sputtering may be used to deposit the metallic material portions in the openings in the patterned photoresist layer 277 directly on physically exposed surfaces of the pad base portions 262 and to deposit the metallic material over the top of the patterned photoresist layer 277, follow by lift-off of the patterned photoresist layer 277. The metal portions in the openings constitute bonding pillar structures 268. Generally, the bonding pillar structures 268 can be formed in the openings in the patterned photoresist layer 277 on a respective one of the pad base portions 262. Each of the bonding pillar structures 268 can have a sidewall that is laterally spaced from the second passivation dielectric layer 250. In one embodiment, the openings in the patterned photoresist layer 277 can have vertical sidewalls, and each of the bonding pillar structures 268 can have a respective uniform horizontal cross-sectional shape that is invariant along a vertical direction. In this case, the sidewalls of the bonding pillar structures 268 can be vertical.

Each contiguous combination of a pad base portion 262 and a bonding pillar structure 268 constitutes a second bonding pad 260. In other words, each second bonding pad 260 may include a vertical stack of a pad base portion 262 and a bonding pillar structure 268. In one embodiment, each of the second bonding pads 260 comprises a pad base portion 262 adjoined to a respective one of the bonding pillar structures 268 and contacting a sidewall of the second passivation dielectric layer 250.

The bonding pillar structure 268 has a lesser lateral dimension than the pad base portion 262. The bonding pillar structures 268 can include at least one metallic material that may be deposited by electroplating or electroless plating. In one embodiment, the bonding pillar structures 268 may include a metallic material such as copper or copper based alloy containing more than 50 atomic percent copper, silver, gold, nickel, brass, palladium, and/or a cobalt-tungsten-phosphor alloy. In one embodiment, the height of the bonding pillar structures 268 may be less selected such that the top surfaces of the bonding pillar structures 268 are formed above the horizontal plane including the second distal surface of the second passivation dielectric layer 250. If selective deposition of the bonding pillar structures 268 is used, then the top surfaces of the bonding pillar structures 268 are formed below a horizontal plane including the top surface of the patterned photoresist layer 277. In one embodiment, the top surfaces of the bonding pillar structures 268 may protrude above the horizontal plane including the second distal surface of the second passivation dielectric layer 250 by a vertical distance in a range from 0.5 microns to 3 microns, such as from 1 micron to 2 microns, although lesser and greater vertical distances may also be employed.

Figure 5F:
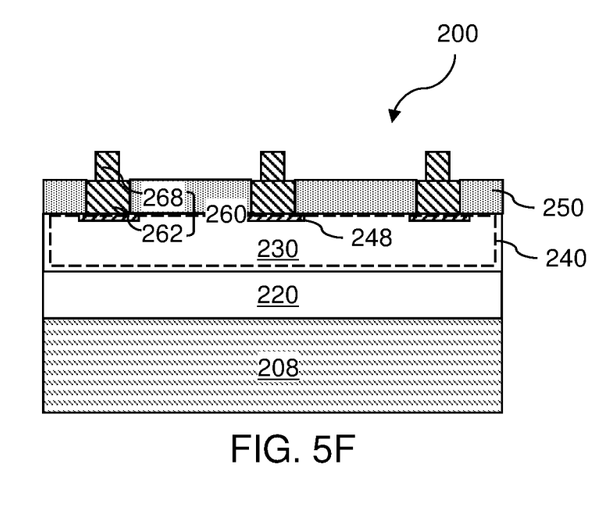

Referring to FIG. 5F, the patterned photoresist layer 277 can be removed, for example, by ashing or by dissolution in a solvent. If the lift-off process is used, then the metallic material deposited on the top surface of the patterned photoresist layer 277 is lifted-off (i.e., removed) to leave the bonding pillar structures 268. A second bonding unit 200 can be provided. Generally, the second bonding unit 200 comprises a second substrate 208, second metal interconnect structures 240 embedded in second dielectric material layers 230, a second passivation dielectric layer 250 having a second proximal surface contacting one of the second dielectric material layers 230 and a second distal surface that is spaced from the second proximal surface by a thickness of the second passivation dielectric layer 250, and second bonding pads 260 comprising a respective bonding pillar structure 268 that protrudes away from a horizontal plane including the second distal surface of the second passivation dielectric layer 250.

Figure 6A:
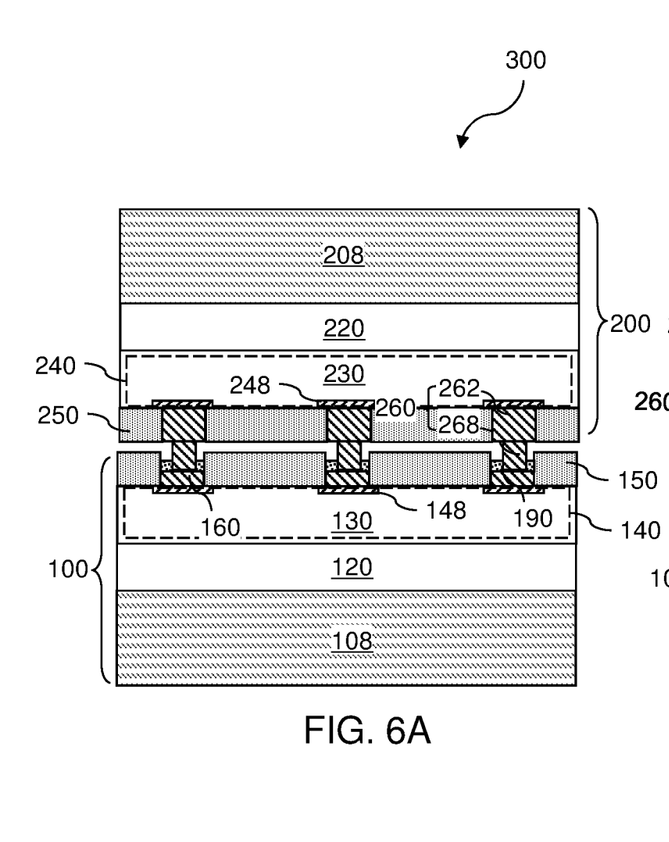
FIG. 6A is a first configuration of a bonded assembly according to an embodiment of the present disclosure.

Referring to FIG. 6A, a bonded assembly of the first bonding unit 100 and the second bonding unit 200 can be formed by positioning the second bonding unit 200 and the first bonding unit such that the bonding pillar structures 268 face a respective one of the solder material portions 190. The array of the bonding pillar structures 268 is aligned to, and is disposed on, the array of the solder material portions 190.

A bonding anneal process can be performed to either soften or reflow the solder material portions 190. The elevated temperature of the anneal process can be selected based on the material composition of the solder material portions 190. The anneal temperature that induces melting of tin solder material portions 190 into the liquid state is typically around 232° C. If the bonding pillar structures 268 comprise copper, then the melting point of copper is 1085° C. Therefore, the bonding anneal temperature may be above 232° C., such as 240° C. to 350° C., including 250° C. to 300° C. The hardness and the elastic modulus of copper does not change significantly at the bonding anneal temperature, while the solder material portions 190 reflow at the bonding anneal temperature. Thus, the liquid solder material portions 190 can be easily squeezed to conform to the shapes of the first bonding pads 160 and the second bonding pads 260 (i.e., the bonding pillar structures) during the bonding.

The array of solder material portions 190 can be reflowed during the bonding anneal, such that when the bonding unit 100 is pressed against bonding unit 200, the bonding pillar structures 268 squeeze out the liquid solder material portions 190 to the side in the openings 152 first passivation dielectric layer 150. Thus, the bonding pillar structures 268 of the second bonding pads 260 may contact the first bonding pads 160. After the bonding anneal, the solder material portions 190 are solidified and provide enhanced bonding between pairs of a respective one of the first bonding pads 160 and a respective one of the bonding pillar structures 268 by surrounding the bonding interface between the pads 160 and the structures 268. Generally, the second bonding unit 200 can be bonded to the first bonding unit 100 by bonding the bonding pillar structures 268 to a respective first bonding pad 160 and solder material portion 190. FIG. 6A illustrates an ideal case in which the first distal surface of the first passivation dielectric layer 150 is parallel to the second distal surface of the second passivation dielectric layer 250 after formation of a bonded assembly of the first bonding unit 100 and the second bonding unit 200.

Figure 6B:
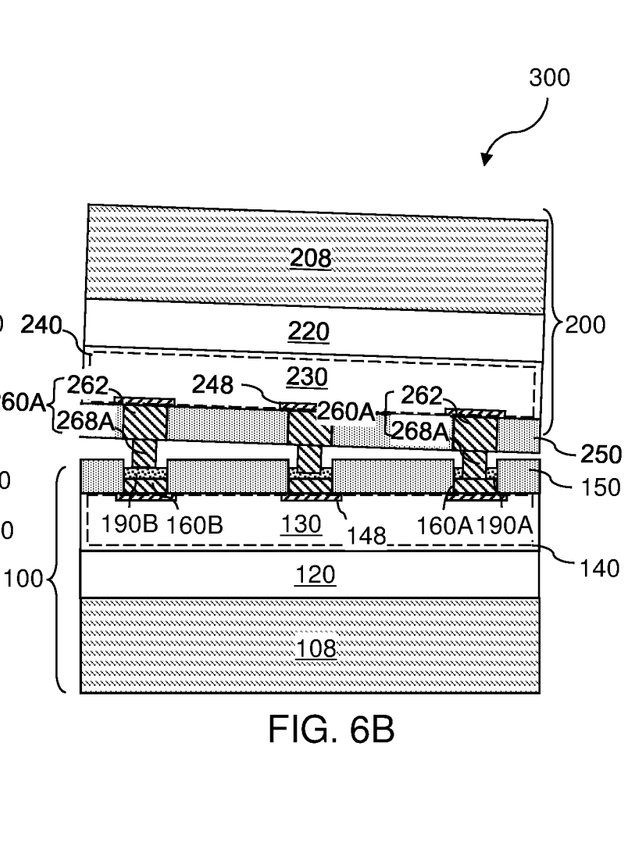
FIG. 6B is a second configuration of a bonded assembly according to an embodiment of the present disclosure.

FIG. 6B is a second configuration of a bonded assembly according to an embodiment of the present disclosure. FIG. 6B illustrates a configuration in which the second bonding unit 200 is tilted relative to the first bonding unit 100 during, and/or after, bonding the second bonding unit 200 to the first bonding unit 100. For example, the second bonding unit 200 may be tilted to the right as shown in FIG. 6B. In this case, the array of solder material portions 190 (including portions 190A and 190B) can be reflowed during the bonding anneal when the bonding unit 100 is pressed against bonding unit 200. The first bonding pillar structure 268A on the right side of the second bonding unit 200 is closer to the first bonding unit 100 than the second bonding pillar structure 268B on the left side of the second bonding unit 200. In this case, the first bonding pillar structure 268A squeezes out the underlying liquid first solder material portion 190A. Thus, the first bonding pillar structure 268A contacts the underlying first bonding pad 160A. In contrast, the second bonding pillar structure 268B does not squeeze out the liquid second solder material portion 190B, and does not contact the underlying first bonding pad 160B. However, after the bonding anneal, the second solder material portion 190B solidifies and contacts both the underlying first bonding pad 160B and the overlying second bonding pillar structure 268B. Therefore, the second solder material portion 190B provides electrical contact between the underlying first bonding pad 160B and the overlying second bonding pillar structures 268B, and an open circuit is avoided between the underlying first bonding pad 160B and the overlying second bonding pillar structure 268B.

The tilt between the second bonding unit 200 and the first bonding unit 100 may be less than arctangent $(1 \times 10^{-3})$. In an illustrative example, if the maximum lateral dimension of the second bonding unit 200 is on the order of 1 cm, the difference in the vertical separation distances on one side of the bonded assembly relative to an opposite side can be less than 10 microns. In one embodiment, a Euclidean two-dimensional plane including the second distal surface of the second passivation dielectric layer 250 may be tilted relative to a Euclidean two-dimensional plane including the first distal surface of the first passivation dielectric layer 150 by an angle in a range from arctangent $(1 \times 10^{-9})$ to arctangent $(1 \times 10^{-3})$.

According to an aspect of the present disclosure, the tilt angle between the second bonding unit 200 and the first bonding unit 100 can be self-limiting due to the metal-to-metal contact that can be provided between a first bonding pad 160A and a bonding pillar structure 268A of a second bonding pad 260. Specifically, the first bonding pads 160 and the second bonding pads 260 include metallic materials that do not reflow during the bonding anneal process that reflows the solder material portions 190.

In an illustrative example of limitation on the tilt angle due to the geometry of the first bonding pads 160 and the second bonding pads, the first bonding unit 100 and the second bonding unit 200 may be semiconductor dies having a square horizontal cross-sectional shape in which each side has a length of 5 mm, and a variation in the vertical separation distance between the two semiconductor dies may be about 2 microns per 1 cm. In this case, the variation in the vertical separation distance can be about 1 micron. In this example, the thickness of each solder material portions 190 (such as tin-containing solder plates) may have a thickness may be equal to, or may be less than, 1 micron. If the total variation in the vertical separation distance is 1 micron, a bonding pillar structure 268A can contact a surface of a first bonding pad 160A at a location of a minimum vertical separation distance.

In one embodiment, each array of bonding pads (160, 260) can have a pitch of about 5 microns, a lateral spacing between a neighboring pad of bonding pads (160, 260) can be in a range from 1 micron to 2 microns. The lateral dimension of each bonding pad (160, 260) can be in a range from 3 microns to 4 microns. The distal surfaces of the solder material portions 190 after the reflow process can be more proximal to the first substrate 108 than the first distal surface of the first passivation dielectric layer 150 is to the first substrate 108. Solder bridging can be avoided by employing a passivation dielectric layer thickness (150, 250) that is greater than the thickness of the solder material portions 190. Thus, an array of solder material portions 190 having a fine pitch can be employed while avoiding the problem of solder bridging.

In case a finite tilt is present between the first bonding unit 100 and the second bonding unit 200, a first subset of the bonding pillar structures 268A directly contacts a first subset of the first bonding pads 160A, and a second subset of the bonding pillar structures 268B does not directly contact any of the first bonding pads 160B, but instead contacts the solder material portion 190B which provides an electrical contact between them, as illustrated in FIG. 6B.

The bonding process may be a die-to-die bonding process, a wafer-to-wafer bonding process, or a wafer-to-die bonding process. In one embodiment, the first bonding unit 100 can be provided within a first wafer including an array of first semiconductor dies, and the first bonding unit 100 can be one of the first semiconductor dies. The second bonding unit 200 can be provided within a second wafer including an array of second semiconductor dies, and the second bonding unit 200 can be one of the second semiconductor dies. In this case, each mating pair of the first semiconductor dies and the second semiconductor dies may be simultaneously bonded by wafer-to-wafer bonding.

In another embodiment, the first wafer may be diced to singulate the first semiconductor dies prior to placement of the first semiconductor dies on a second wafer including an array of second semiconductor dies. Alternatively, the second wafer may be diced to singulate the second semiconductor dies prior to placement of the second semiconductor dies on a first wafer including an array of first semiconductor dies. In such cases, a wafer-to-die bonding process may be performed.

In yet another embodiment, the first wafer may be diced and the second wafer may be diced prior to bonding a mating pair of a first semiconductor die and a second semiconductor die. In this case, a die-to-die bonding process may be employed.

In still another embodiment, one of the first bonding unit 100 and the second bonding unit 200 comprises a semiconductor die including semiconductor devices (120 or 220) therein; and another of the first bonding unit 100 and the second bonding unit 200 comprises an interposer. In this case, semiconductor die can be bonded to the interposer employing the methods of the present disclosure.

Referring to all drawings and according to various embodiments of the present disclosure, a bonded assembly 300 comprises a first bonding unit 100 comprising a first substrate 108, first metal interconnect structures 140 embedded in first dielectric material layers 130, a first passivation dielectric layer 250 having a first proximal surface contacting one of the first dielectric material layers 130 and a first distal surface that is spaced from the first proximal surface by a thickness of the first passivation dielectric layer 150, first bonding pads 160 located within and laterally surrounded by a respective opening 152 in the first passivation dielectric layer 150, wherein distal surfaces of the first bonding pads 160 are recessed relative to the first distal surface of the first passivation dielectric layer 150, and solder material portions 190 located within and laterally surrounded by a respective opening 152 in the first passivation dielectric layer 150. The bonded assembly 300 also comprises second bonding unit 200 comprising a second substrate 208, second metal interconnect structures 240 embedded in second dielectric material layers 230, a second passivation dielectric layer 250 having a second proximal surface contacting one of the second dielectric material layers 230 and a second distal surface that is spaced from the second proximal surface by a thickness of the second passivation dielectric layer 250, and second bonding pads 260 located within and laterally surrounded by a respective opening 252 the second passivation dielectric layer 250. Each of the second bonding pads 260 comprises a bonding pillar structure 268 that protrudes past a horizontal plane including the second distal surface. A first subset (e.g., 268A) of the bonding pillar structures 268 directly contacts a first subset (e.g., 160A) of the first bonding pads 160. A second subset (e.g., 268B) of the bonding pillar structures 268 does not directly contact any of the first bonding pads 16. A respective one of a second subset (e.g., 190B) of the solder material portions 190 is located between each one of the second subset 268B of the bonding pillar structures 268 and each respective one of a second subset 160B of the first bonding pads 160. The respective one of the second subset 190B of solder material portions 190 provides electrical contact between each one of the second subset 268B of the bonding pillar structures 268 and each respective one of the second subset 160B of the first bonding pads 160.

In one embodiment, the first bonding unit 100 is tilted with respect to the second bonding unit 200. In one embodiment, the solder material portions 190 comprise tin or a tin based alloy containing greater than 50 atomic percent tin, the first bonding pads 160 comprise copper or a copper based alloy containing greater than 50 atomic percent copper, and the bonding pillar structures 268 comprise copper or a copper based alloy containing greater than 50 atomic percent copper.

In one embodiment, a respective one of a first subset 190A of the solder material portions 190 is located between sidewalls of a respective one of the first subset 268A of the bonding pillar structures 268 and sidewalls of the respective opening 152 in the first passivation dielectric layer 150. The respective one of the first subset 190A of the solder material portions 190 contacts the distal surface of a respective one of the first subset 160A of the first bonding pads 160, and surrounds a bonding interface between the distal surface of the respective one of the first subset 160A of the first bonding pads 160 and a surface of the respective one of the first subset 268A of the bonding pillar structures 268.

In one embodiment, each of the first bonding pads 160 has a sidewall that contacts the first passivation dielectric layer 150, and each of the bonding pillar structures 268 has a sidewall that is laterally spaced from the second passivation dielectric layer 250. Each of the second bonding pads 260 comprises a pad base portion 262 adjoined to a respective one of the bonding pillar structures 268 and contacting a sidewall of the second passivation dielectric layer 250. In one embodiment, the second distal surface of the second passivation dielectric layer 250 is vertically spaced from the first distal surface of the first passivation dielectric layer 150.

In one embodiment, the first bonding unit 100 comprises a first semiconductor die including first semiconductor devices 120 located on the first substrate 108 and embedded in the first dielectric material layers 130; and the second bonding unit 200 comprises a second semiconductor die including second semiconductor devices 220 located on the second substrate 208 and embedded in the second dielectric material layers 230. In one embodiment, the first semiconductor devices comprise three-dimensional memory devices, and the second semiconductor devices comprise peripheral devices for the three-dimensional memory devices.

In another embodiment, one of the first bonding unit 100 and the second bonding unit 200 comprises a semiconductor die including semiconductor devices therein; and another of the first bonding unit 100 and the second bonding unit 200 comprises an interposer.

The various embodiments of the present disclosure can be employed to provide a bonded assembly having lower failure rates and providing higher bonding reliability in case of titling between the respective bonding units.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

The invention claimed is:

1. A bonded assembly, comprising:
a first bonding unit comprising a first substrate, first metal interconnect structures embedded in first dielectric material layers, a first passivation dielectric layer having a first proximal surface contacting one of the first dielectric material layers and a first distal surface that is spaced from the first proximal surface by a thickness of the first passivation dielectric layer, first bonding pads located within and laterally surrounded by a respective opening in the first passivation dielectric layer, wherein distal surfaces of the first bonding pads are recessed relative to the first distal surface of the first passivation dielectric layer, and solder material portions located within and laterally surrounded by a respective opening in the first passivation dielectric layer; and a second bonding unit comprising a second substrate, second metal interconnect structures embedded in second dielectric material layers, a second passivation dielectric layer having a second proximal surface contacting one of the second dielectric material layers and a second distal surface that is spaced from the second proximal surface by a thickness of the second passivation dielectric layer, and second bonding pads located within and laterally surrounded by a respective opening the second passivation dielectric layer, wherein each of the second bonding pads comprises a bonding pillar structure that protrudes past a horizontal plane including the second distal surface, wherein:
a first subset of the bonding pillar structures directly contacts a first subset of the first bonding pads; and
a second subset of the bonding pillar structures does not directly contact any of the first bonding pads, such that a respective one of a second subset of the solder material portions is located between each one of the second subset of the bonding pillar structures and each respective one of a second subset of the first bonding pads, and such that the respective one of the second subset of the solder material portions provides electrical contact between each one of the second subset of the bonding pillar structures and each respective one of the second subset of the first bonding pads.

2. The bonded assembly of claim 1, wherein the first bonding unit is tilted with respect to the second bonding unit.

3. The bonded assembly of claim 1, wherein:
the solder material portions comprise tin or a tin based alloy;
the first bonding pads comprise copper or a copper based alloy; and
the bonding pillar structures comprise copper or a copper based alloy.

4. The bonded assembly of claim 1, wherein a respective one of a first subset of the solder material portions is located between sidewalls of a respective one of the first subset of the bonding pillar structures and sidewalls of the respective opening in the first passivation dielectric layer.

5. The bonded assembly of claim 4, wherein the respective one of the first subset of the solder material portions contacts the distal surface of a respective one of the first subset of the first bonding pads, and surrounds a bonding interface between the distal surface of the respective one of the first subset of the first bonding pads and a surface of the respective one of the first subset of the bonding pillar structures.

6. The bonded assembly of claim 1, wherein each of the first bonding pads has a sidewall that contacts the first passivation dielectric layer.

7. The bonded assembly of claim 1, wherein each of the bonding pillar structures has a sidewall that is laterally spaced from the second passivation dielectric layer.

8. The bonded assembly of claim 7, wherein each of the second bonding pads comprises a pad base portion adjoined to a respective one of the bonding pillar structures and contacting a sidewall of the second passivation dielectric layer.

9. The bonded assembly of claim 1, wherein the second distal surface of the second passivation dielectric layer is vertically spaced from the first distal surface of the first passivation dielectric layer.

10. The bonded assembly of claim 1, wherein:
the first bonding unit comprises a first semiconductor die including first semiconductor devices located on the first substrate and embedded in the first dielectric material layers; and
the second bonding unit comprises a second semiconductor die including second semiconductor devices located on the second substrate and embedded in the second dielectric material layers.

11. The bonded assembly of claim 10, wherein:
the first semiconductor devices comprise three-dimensional memory devices; and
the second semiconductor devices comprise peripheral devices for the three-dimensional memory devices.

12. The bonded assembly of claim 1, wherein:
one of the first bonding unit and the second bonding unit comprises a semiconductor die including semiconductor devices therein; and
another of the first bonding unit and the second bonding unit comprises an interposer.

13. A method of forming a bonded assembly, comprising:
providing a first bonding unit, wherein the first bonding unit comprises a first substrate, first metal interconnect structures embedded in first dielectric material layers, a first passivation dielectric layer having a first proximal surface contacting one of the first dielectric material layers and a first distal surface that is spaced from the first proximal surface by a thickness of the first passivation dielectric layer, and first bonding pads located within and laterally surrounded by a respective opening in the first passivation dielectric layer, wherein distal surfaces of the first bonding pads are recessed relative to the first distal surface of the first passivation dielectric layer;
forming solder material portions on physically exposed surfaces of the first bonding pads;
providing a second bonding unit, wherein the second bonding unit comprises a second substrate, second metal interconnect structures embedded in second dielectric material layers, a second passivation dielectric layer having a second proximal surface contacting one of the second dielectric material layers and a second distal surface that is spaced from the second proximal surface by a thickness of the second passivation dielectric layer and second bonding pads located within and laterally surrounded by a respective opening the second passivation dielectric layer, wherein each of the second bonding pads comprises a bonding pillar structure that protrudes past a horizontal plane including the second distal surface; and
reflowing the solder material portions while pressing the first bonding unit and the second bonding unit to each other such that at least a first subset of the bonding pillar structures squeezes out a first subset of the solder material portions and directly contacts a first subset of the first bonding pads.

14. The method of claim 13, wherein:
the first bonding unit is tilted with respect to the second bonding unit; and
a second subset of the bonding pillar structures does not directly contact any of the first bonding pads and does not completely squeeze out a second subset of the solder material portions, such that a respective one of a second subset of solder material portions is located between each one of the second subset of the bonding pillar structures and each respective one of a second subset of the first bonding pads, and such that the respective one of the second subset of solder material portions provides electrical contact between each one of the second subset of the bonding pillar structures and each respective one of the second subset of the first bonding pads.

15. The method claim 13, wherein:
a respective one of a first subset of the solder material portions is located between sidewalls of a respective one of the first subset of the bonding pillar structures and sidewalls of the respective opening in the first passivation dielectric layer; and
the respective one of the first subset of the solder material portions contacts the distal surface of a respective one of the first subset of the first bonding pads, and surrounds a bonding interface between the distal surface of the respective one of the first subset of the first bonding pads and a surface of the respective one of the first subset of the bonding pillar structures.

16. The method claim 13, wherein:
the solder material portions comprise tin or a tin based alloy;
the first bonding pads comprise copper or a copper based alloy;
the bonding pillar structures comprise copper or a copper based alloy; and
reflowing the solder material portions occurs at a temperature above a melting temperature of the solder material portions and below a melting temperature of the first bonding pads and the bonding pillar structures.

17. The method claim 16, wherein providing the first bonding unit comprises:
forming a blanket passivation dielectric layer over a top surface of the first dielectric material layers;
forming openings through the blanket passivation dielectric layer, wherein the blanket passivation dielectric layer becomes the first passivation dielectric layer; and
forming the first bonding pads by selectively depositing copper or copper based alloy portions within the openings in the first passivation dielectric layer.

18. The method of claim 17, wherein forming the solder material portions comprises immersion deposition of a solder material directly on surfaces of the first bonding pads employing an immersion plating bath.

19. The method of claim 17, wherein forming the solder material portions comprises:
plating solder material portions on the first bonding pads;
planarizing the solder material by removing portions of the solder material from above a horizontal plane including the first distal surface; and
vertically recessing remaining portions of the solder material within the openings in the first passivation dielectric layer.

20. The method of claim 17, wherein the step of forming the first bonding pads by selectively depositing copper or copper based alloy portions within the openings in the first passivation dielectric layer comprises:
electroplating the copper or the copper based alloy directly on surfaces of a subset of the first metal interconnect structures within the openings in the first passivation dielectric layer;
removing portions of the copper or the copper based alloy from above a horizontal plane including the first distal surface; and vertically recessing remaining portions of the copper or the copper based alloy within the openings in the first passivation dielectric layer.

\* \* \* \* \*